US006428847B1

(12) United States Patent
Grant et al.

(10) Patent No.: US 6,428,847 B1
(45) Date of Patent: Aug. 6, 2002

(54) VORTEX BASED CVD REACTOR

(75) Inventors: Robert W. Grant, Camden, ME (US); Benjamin J. Petrone, Mt. Bethel, PA (US); Matthew D. Brubaker, Colorado Springs, CO (US); Paul D. Mumbauer, Coopersburg, PA (US)

(73) Assignee: Primaxx, Inc., Allentown, PA (US)

( * ) Notice: Subject to any disclaimer, the term of this patent is extended or adjusted under 35 U.S.C. 154(b) by 0 days.

(21) Appl. No.: 09/688,555

(22) Filed: Oct. 16, 2000

(51) Int. Cl.[7] .................................... C23C 16/00

(52) U.S. Cl. .................... 427/248.1; 118/715; 118/729; 118/725

(58) Field of Search ................................ 118/715, 725, 118/729; 427/248.1

(56) References Cited

U.S. PATENT DOCUMENTS 3,717,439 A * 2/1973 Sakai ........................ 118/725
4,649,859 A * 3/1987 Wanlass ..................... 118/715
4,825,809 A * 5/1989 Mieno ........................ 118/725
5,078,091 A * 1/1992 Stewart ...................... 118/715
5,229,081 A * 7/1993 Suda .......................... 118/717
5,273,588 A * 12/1993 Foster ........................ 118/715
5,284,519 A 2/1994 Gadgil
5,672,204 A * 9/1997 Habuka ...................... 118/715
5,885,353 A * 3/1999 Strodtbeck .................. 118/500
5,951,771 A 9/1999 Raney et al.
5,985,033 A 11/1999 Yudovsky et al.
6,174,377 B1 * 1/2001 Doering ...................... 118/725

* cited by examiner

*Primary Examiner*—Richard Bueker
(74) *Attorney, Agent, or Firm*—Hugh D. Jaeger

(57) ABSTRACT

Chemical vapor deposition reactor incorporating gas flow vortex formation for uniform chemical vapor deposition upon a stationary wafer substrate. Gas flow including chemical vapors is introduced in tangential fashion to the interior of the heated reactor to provide for suitable uniform boundary layer control within the reactor upon the stationary wafer substrate.

18 Claims, 8 Drawing Sheets

10
22a-22n
26
18
90
86
88
78
24
14
62a
58a-58n
56a-56n
84
80
82
30
60a-60n
76
50a
46
48
50
62
32
12
52
28
34
64
36
40
38
54
44
42a-42n
42a-42n 82
80

56b
36
44
42a-42n
56n
52
56a
68
72
64
66
74
70
62
32
30
28
12

10
22a
78
30
32
62
28
26
18
92
94
24
50
90
86
88
14
84
80
82
12
48
46
34
38
52
36
40
42a-42n
44
42a-42n
54
64

VORTEX BASED CVD REACTOR

CROSS REFERENCES TO CO-PENDING APPLICATIONS

None.

BACKGROUND OF THE INVENTION

1. Field of the Invention

The present invention is for a chemical vapor deposition reactor, and, more specifically, is for a chemical vapor deposition reactor incorporating gas flow vortex mixing action for uniform chemical vapor deposition upon a stationary wafer substrate. Gas flow including chemical vapors is introduced in tangential fashion to the interior of the heated reactor to provide for suitable uniform rotation of the gas field within the reactor and create a uniform boundary layer over the stationary wafer substrate.

2. Description of the Prior Art

Prior art reactors used for chemical vapor deposition on a wafer substrate often incorporated rotating heated chucks which held the wafer substrate which was rotated into the path of oncoming chemical vapor emanating from a multiple orifice injector device often referred to as functioning similarly to a shower head. Proximity of the heated rotating chuck to the multiple orifice injector device caused undesired heating of the multiple orifice injector device to cause the chemical vapor to decompose at high temperatures. As a result, chemical vapor was turned into particulate matter which clung to and which was deposited in the multiple orifices, thereby causing clogging of the orifices to cause flow restriction and improper chemical vapor deposition on the wafer substrate. Such clogging required shutting down of the process so that the orifices could be cleaned. Also, because of poor temperature regulation, the chemical vapor would decompose and would be deposited on the sidewalls of the reactor, thereby causing inefficient operation which also required shutdown for cleaning purposes. Rotating heated chucks also required elaborate vacuum pumping schemes, and a way to transfer heat to the rotating heated chuck. The use of pyrometry and associated circuitry was also required to sense and control chuck temperature. Clearly what is needed is a CVD reactor which overcomes the problems found in prior art devices.

SUMMARY OF THE INVENTION

The general purpose of the present invention is to provide a reactor for deposition of chemical vapor onto a substrate wherein chemical vapors introduced into the reactor will disperse uniformly onto the substrate without the need for rotating or otherwise moving the substrate.

According to the present invention, the above stated general purpose is achieved by a vortex based CVD reactor including a reactor base, a reactor sidewall located above and secured to the reactor base, a top located above and secured and fitted to the reactor sidewall, injector tubes tangentially oriented and secured to the reactor top, a reactor interior comprised of the inner surfaces of the reactor base, reactor side walls and reactor top, a heated densified carbon susceptor located in intimate contact with a resistance heated chuck, a lift yoke and ceramic wafer substrate support pins, a robotic access port located in the reactor base, a positionable shutter aligned with the robotic access port, and an exhaust port located at the upper region of the reactor top. The tangentially oriented injector tubes serve to introduce chemical vapors into the reactor in tangential fashion, thereby creating spinning gas fields which cause a uniform boundary layer to form over the substrate whereby the chemical vapors deposit uniformly.

The reactive gas is introduced at or above its boiling point, and is caused to react at the substrate that is held at its higher, decomposition temperature.

One significant aspect and feature of the present invention is a CVD reactor which incorporates a vortex gas flow for the uniform deposition of chemical vapors upon a wafer substrate.

Another significant aspect and feature of the present invention is the use of tangentially located injector tubes at the reactor top for the introduction of chemical vapors to the reactor interior in tangential fashion.

Still another significant aspect and feature of the present invention is the chemical vapor deposition upon a wafer substrate which is stationary.

Yet another significant aspect and feature of the present invention is a CVD reactor having a minimum of moving parts.

A further significant aspect and feature of the present invention is a CVD reactor which eliminates or minimizes the deposit of particulates on the reactor components.

A further significant aspect and feature of the present invention is a CVD reactor having a positionable shutter to provide a non-interrupted reactor interior.

Having thus described an embodiment of the present invention and set forth significant aspects and features thereof, it is the principal object of the present invention to provide a vortex based CVD reactor.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
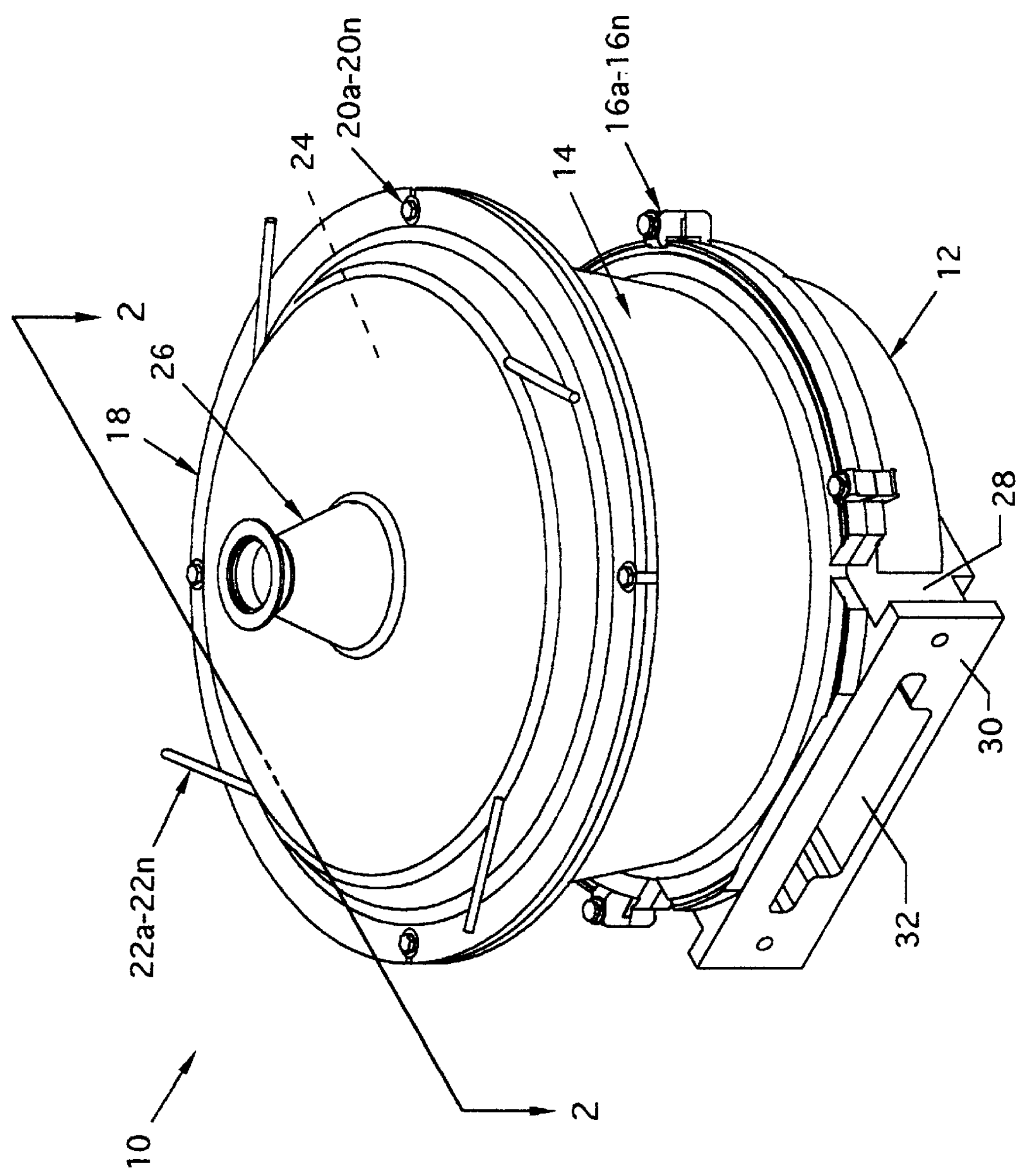
FIG. 1 illustrates an isometric view of a vortex based CVD reactor, the present invention.

FIG. 1 illustrates an isometric view of a vortex based CVD (chemical vapor deposition) reactor, also referred to as the CVD reactor 10. Components illustrated in FIG. 1 include a circular reactor base 12, a circular sidewall 14 located above and fitted to and secured to the reactor base 12 by a plurality of clamps 16a–16n, a circular reactor top 18 located above and fitted to and secured to the reactor sidewall 14 by a plurality of hardware assemblies 20a–20n, a plurality of injector tubes 22a–22n tangentially secured to and extending through the reactor top 18 and communicating with the reactor interior 24 (FIG. 2), an exhaust port 26 centrally located at the reactor top 18 in communication with the reactor interior 24, a rectangular reactor base extension 28 extending outwardly from the reactor base 12 having a flange 30, and, a robotic arm access port 32 located central to the rectangular reactor base extension 28 in communication with the reactor interior 24.

Figure 2:
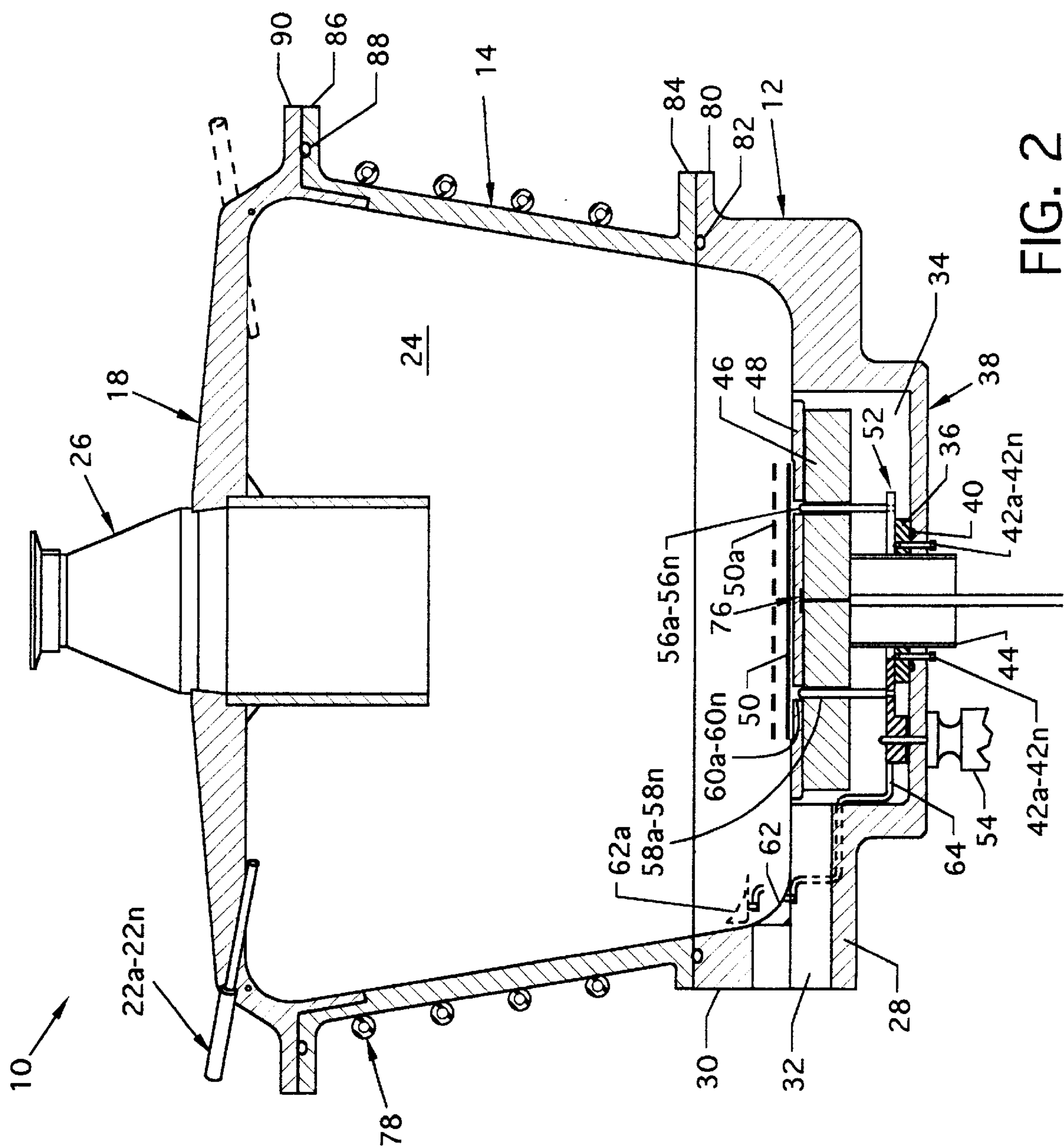
FIG. 2 illustrates a cross section view of the vortex based CVD reactor along line 2—2 of FIG. 1.
Figure 3:
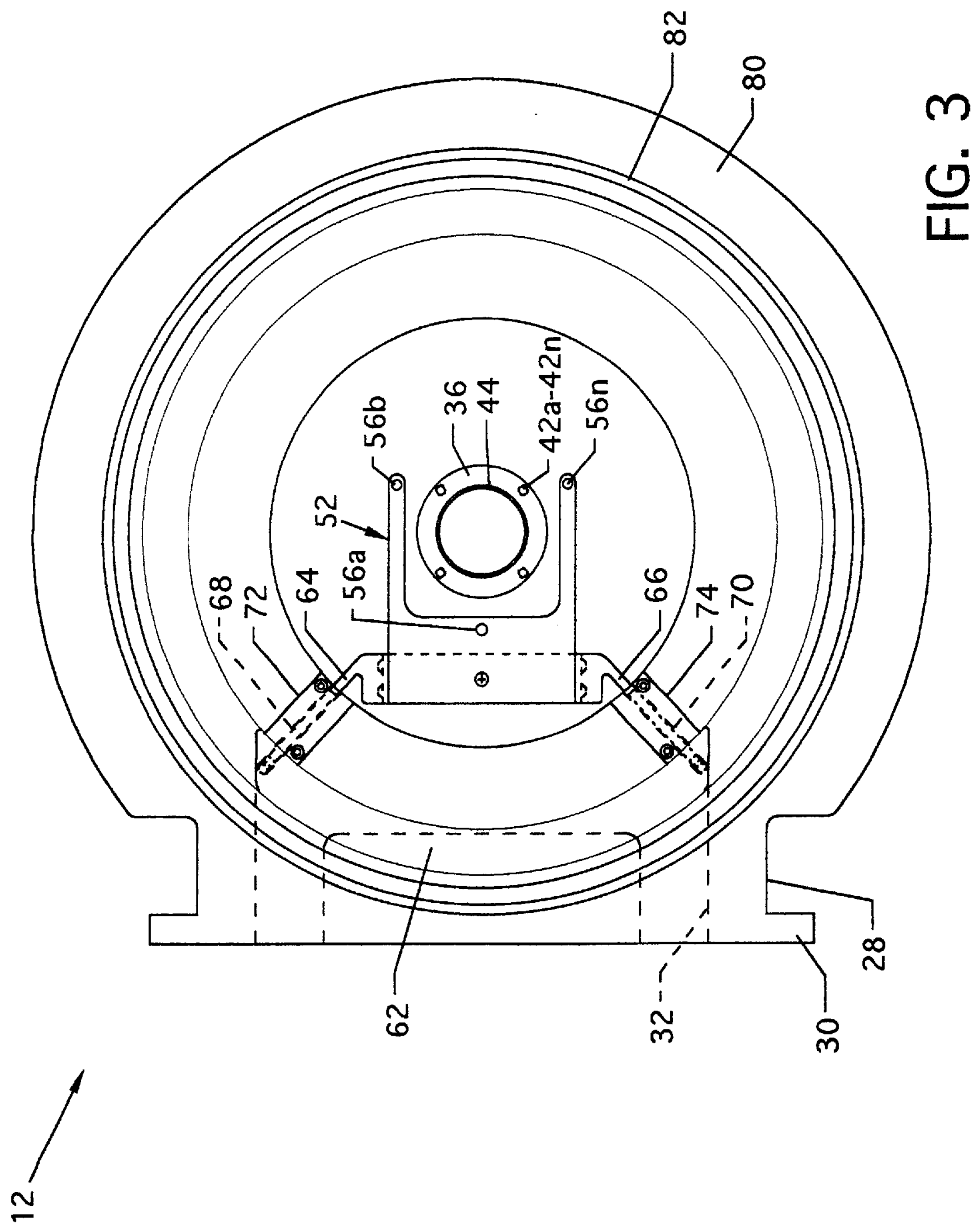
FIG. 3 illustrates a top view of the reactor base.
Figure 4:
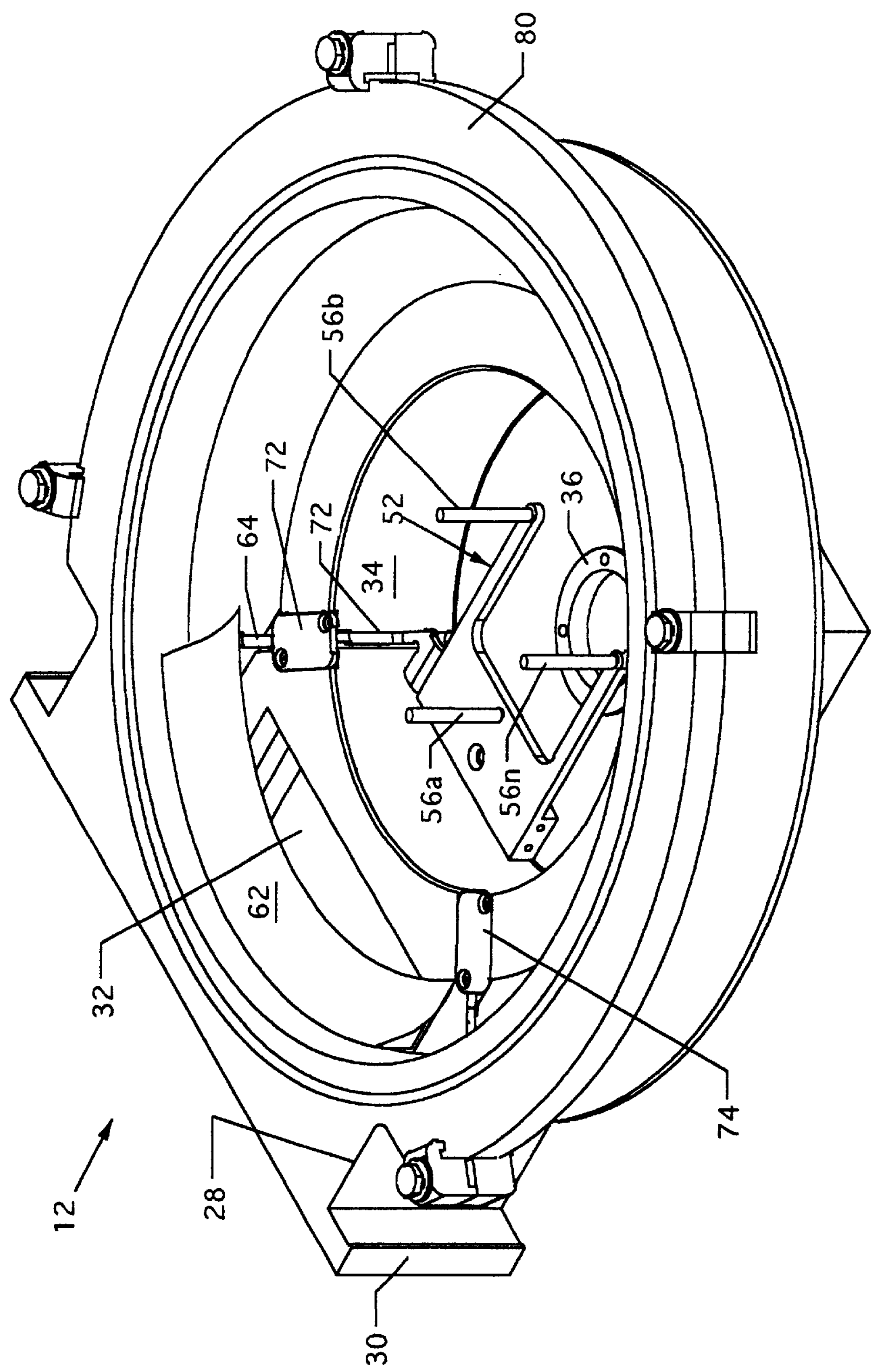
FIG. 4 illustrates an isometric view of the reactor base.

FIG. 2 illustrates a cross section view of the vortex based CVD reactor 10 along line 2—2 of FIG. 1, where all numerals mentioned previously correspond to those elements previously described. Illustrated in particular are the components located in or adjacent to a cavity 34 located in the reactor base 12. The cavity 34 houses a variety of components, most of which are also shown in FIGS. 3 and 4, as now described. An attachment ring 36 seals against the lower planar region 38 of the reactor base 12 by the use of an O-ring 40 and a plurality of machine screws 42a–42n. A connecting support collar 44 extends vertically through the lower planar region 38 of the reactor base 12 and through the attachment ring 36 to support a resistance heated chuck 46. A removable densified carbon susceptor 48 aligns in intimate contact with the resistance heated chuck 46 and uniformly transfers heat to a wafer substrate 50 which intimately contacts the densified carbon susceptor 48. A lift yoke 52 which is actuated vertically by an air cylinder lift arm 54 aligns with sufficient clearance about the connecting support collar 44. A plurality of upwardly directed ceramic lift pins 56a–56n secure to the lift yoke 52 and extend freely through a plurality of mutually aligned body holes 58a–58n and 60a–60n in the heated chuck 46 and the densified carbon susceptor 48, respectively. The tops of the ceramic lift pins 56a–56n can extend beyond the upper surface of the densified carbon susceptor 48 when the lift yoke 52 is actuated to its uppermost travel.

The ceramic lift pins 56a–56n support or position a wafer substrate 50 vertically either to be processed or to be positioned by robotic handling. The lift yoke 52 is shown in its lowermost position whereby the wafer substrate 50 is allowed to intimately contact the densified carbon susceptor 48 for processing. Also attached to the lift yoke 52 is a positionable shutter 62, also shown in FIGS. 3 and 4. The shutter 62 is shaped to conform with the contour of the lower region of the reactor base 12 to assist in providing a uniformly smooth shaped reactor interior 24. Multiply angled brackets 64 and 66 suitably secure to the lift yoke 52 and are located in channels 68 and 70 (FIG. 3) in the lower region of the reactor base 12 to attach to and to provide for support for the positionable shutter 62. Plates 72 and 74 secure over and about the channels 68 and 70 to limit the upward movement of the multiply angled brackets 64 and 66 and correspondingly to limit the upward movement of the shutter 62 in the open mode. For robotic handling the lift yoke 52 is positioned upwardly to position the ceramic lift pins 56a–56n above the upper surface of the densified carbon receptor 48, thereby moving the processed wafer substrate 50 to a position shown in dashed lines and designated with reference alphanumeric symbol 50a. Simultaneously, the shutter 62 is positioned upwardly as shown by dashed lines and referenced by alphanumeric symbol 62a to allow access to the reactor interior 24 by robotic means entering through the robotic arm access port 32. For insertion of a wafer substrate, the lift yoke 52 including the shutter 62 and ceramic lift pins 56a–56n is positioned to its full upward position whereby robotic handling equipment deposits a wafer substrate upon the extended ceramic lift pins 56a–56n. The lift yoke 52 is then lowered to deposit the wafer substrate on the densified carbon susceptor 48 and to close the shutter 62.

A thermocouple 76 is located in the heated chuck 46 to sample and control temperature of the heated chuck 46 and the densified carbon susceptor 48 during the deposition process. A resistance heater 78 surrounds the reactor sidewall 14. Also shown is flange 80 at the upper edge of the reactor base 12, which, with an O-ring 82, seals against a lower flange 84 of the reactor sidewall 14. An upper flange 86 along with an O-ring 88 seals against a flange 90 located on the reactor top 18.

FIG. 3 illustrates a top view of the reactor base 12, where all numerals correspond to those elements previously described. Illustrated in particular is the relationship of the lift yoke 52 and the attached shutter 62 to the reactor base 12, as previously described.

FIG. 4 illustrates an isometric view of the reactor base 12, where all numerals correspond to those elements previously described. The lift yoke 52 is shown positioned upwardly by the air cylinder lift arm 54 to accept placement of a wafer substrate 50 such as by robotic handling equipment. Positioning of the lift yoke 52 upwardly also positions the attached shutter 62 by the multiply angled brackets 64 and 66 (not shown) so that robotic equipment may access the interior of the CVD reactor 10 through the robotic arm access port 32 to place or retrieve a wafer substrate 50.

Mode of Operation

Figure 5:
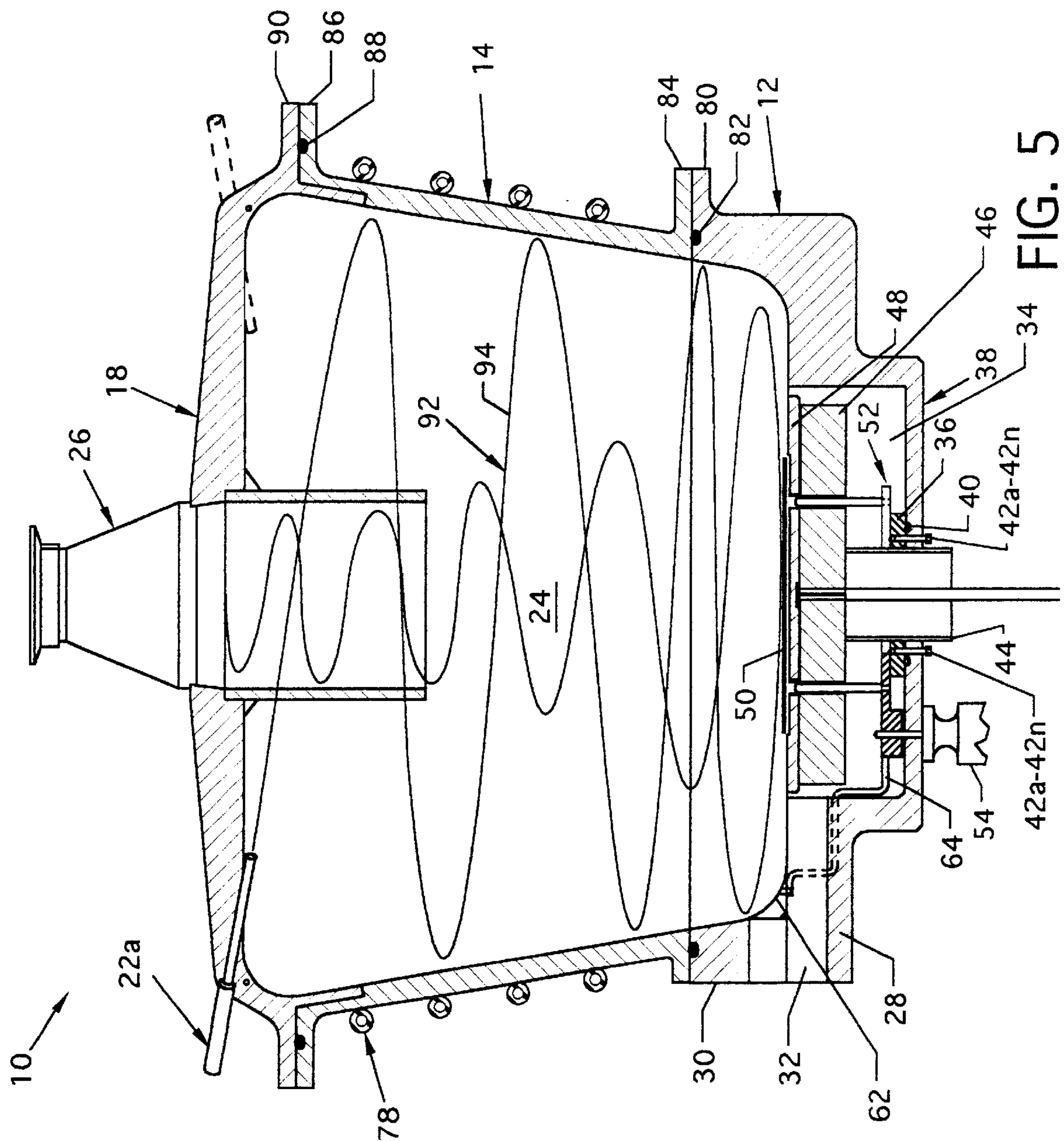
FIG. 5 illustrates a cross section view of the vortex based CVD reactor showing a spinning gas field within the reactor interior.

FIG. 5 illustrates a cross section view of the vortex based CVD reactor 10 showing a spinning gas field 92 within the reactor interior 24, where all numerals mentioned previously correspond to those elements previously described. Chemical vapors are introduced into the reactor interior 24 simultaneously under sufficient pressure and at suitable temperature through the injector tubes 22a–22n. Chemical vapors 94 emanate from injector tubes 22a–22n and produce spinning gas fields. For purposes of brevity and clarity, only the spinning gas field 92 produced by and emanating from the injector tube 22a is shown, it being understood that multiple complementary spinning gas fields are produced by and emanate from the remaining injector tubes 22b–22n in a similar fashion. The injector tubes 22a–22n are oriented to direct the spinning gas field(s) 92 containing chemical vapors 94 tangentially with respect to the interior walls of the reactor sidewall 14. The rotating gas field moves downward due to the reduced diameter of the reactor (i.e., lower pressure area). The downward spiraling gas hits the lower surface and substrate and is subject to drag. Loss of velocity from drag causes the gas to flow inward and upward to where the pressure is lower. Therefore, the gas spirals upward and out of the reactor exhaust. Conservation of angular momentum maintains continuity of spiral direction and low turbulence. See FIG. 7 (side view) and FIG. 8 (top view at substrate plane).

Figure 6:
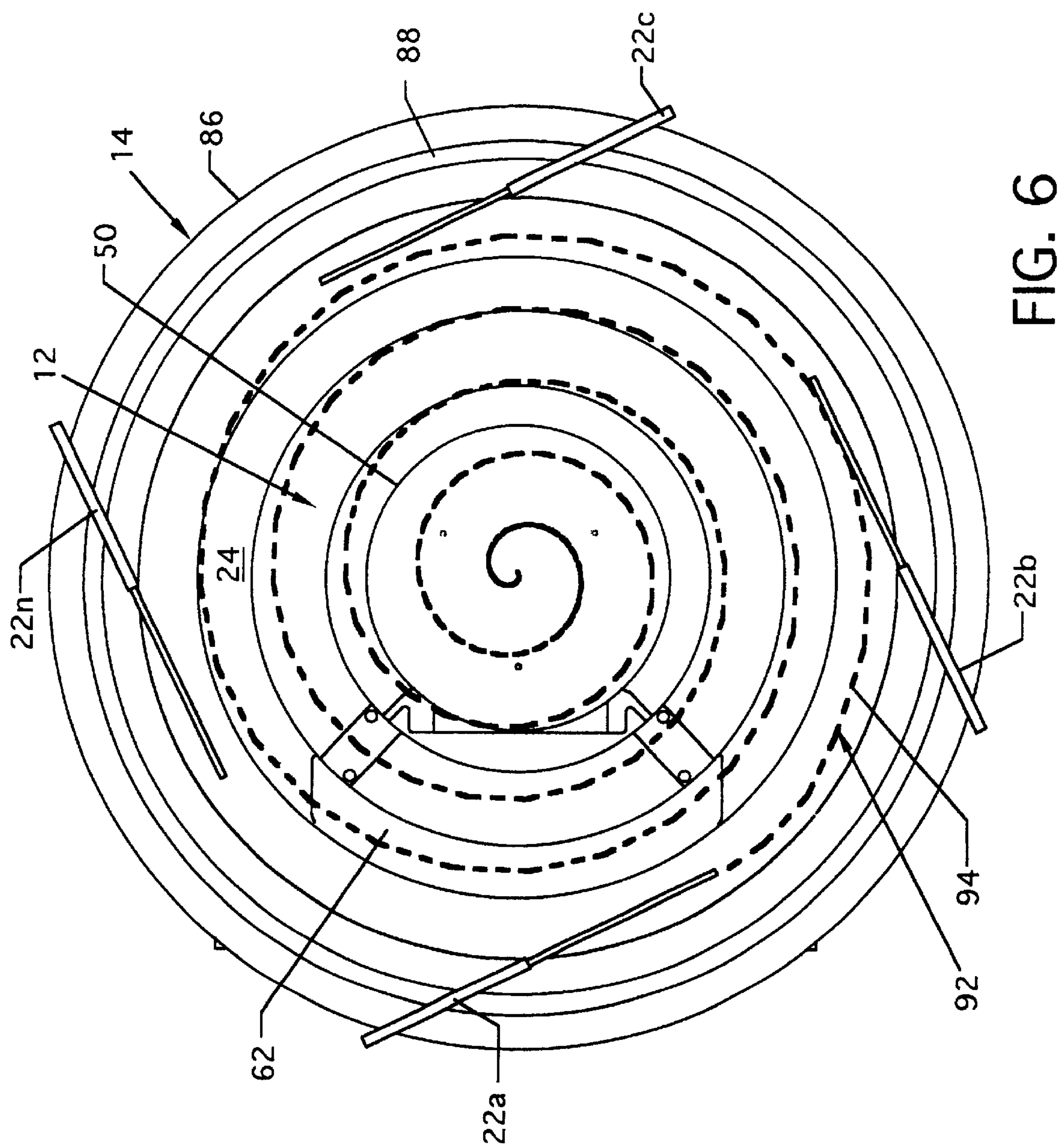
FIG. 6 illustrates a top view of the vortex based CVD reactor showing the spinning gas field in the reactor interior.

FIG. 6 illustrates a top view of the vortex based CVD reactor 10 where the reactor top 18 is not shown for purposes of brevity and clarity, but the injector tubes 22a–22n are shown poised above the reactor interior 24 of the CVD reactor 10. As in FIG. 5, and for purposes of brevity and clarity, only the spinning gas field 92 produced by and emanating from the one injector tube 22a is shown, it being understood that multiple complementary spinning gas fields are produced by and emanate from the remaining injector tubes **22*b*–22*n*** in a similar fashion. All numerals correspond to those elements previously described.

Figure 7:
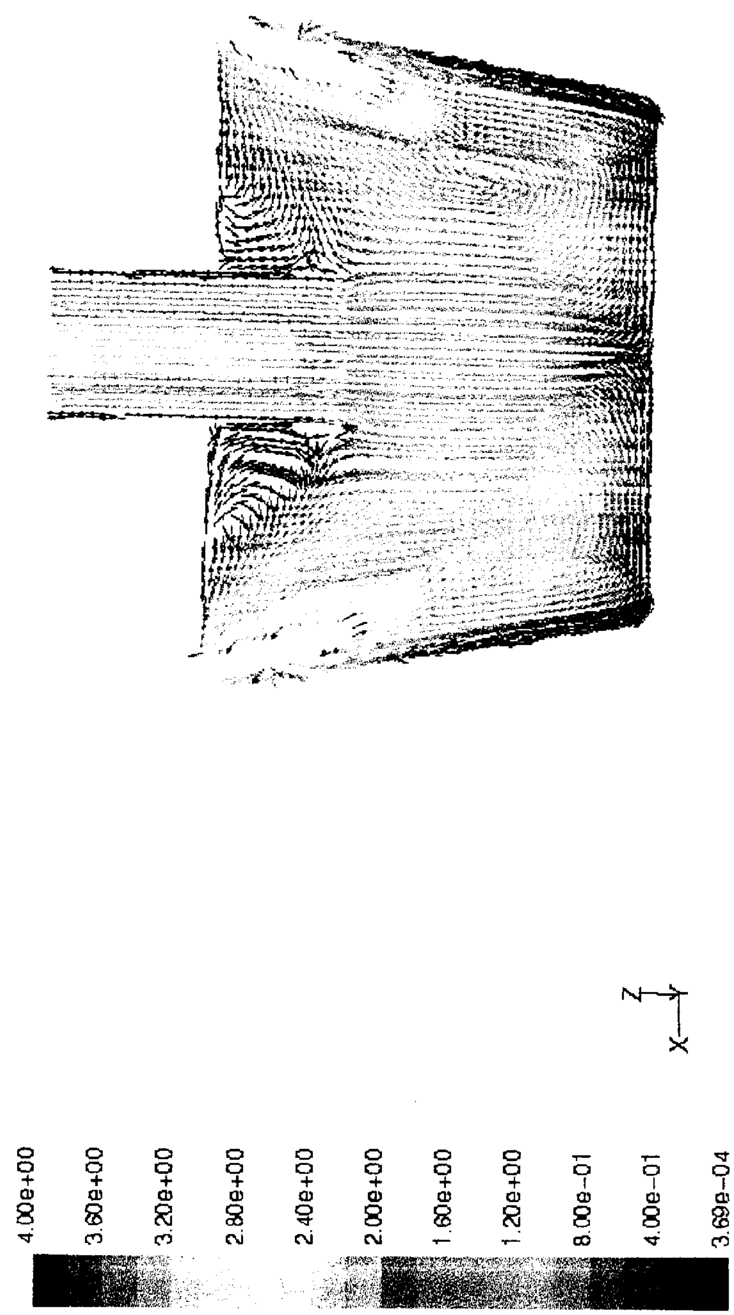
FIG. 7 illustrates the flow of gas as simulated by using the exact dimensions, gas type, and temperature; and, FIG. 8 illustrates a top view of the rotating gas field at the plane of the substrate, showing good homogeneity of the spiraling gas.

FIG. 7 illustrates an exact fluidic simulation of the proposed vortex CVD reactor.

Figure 8:
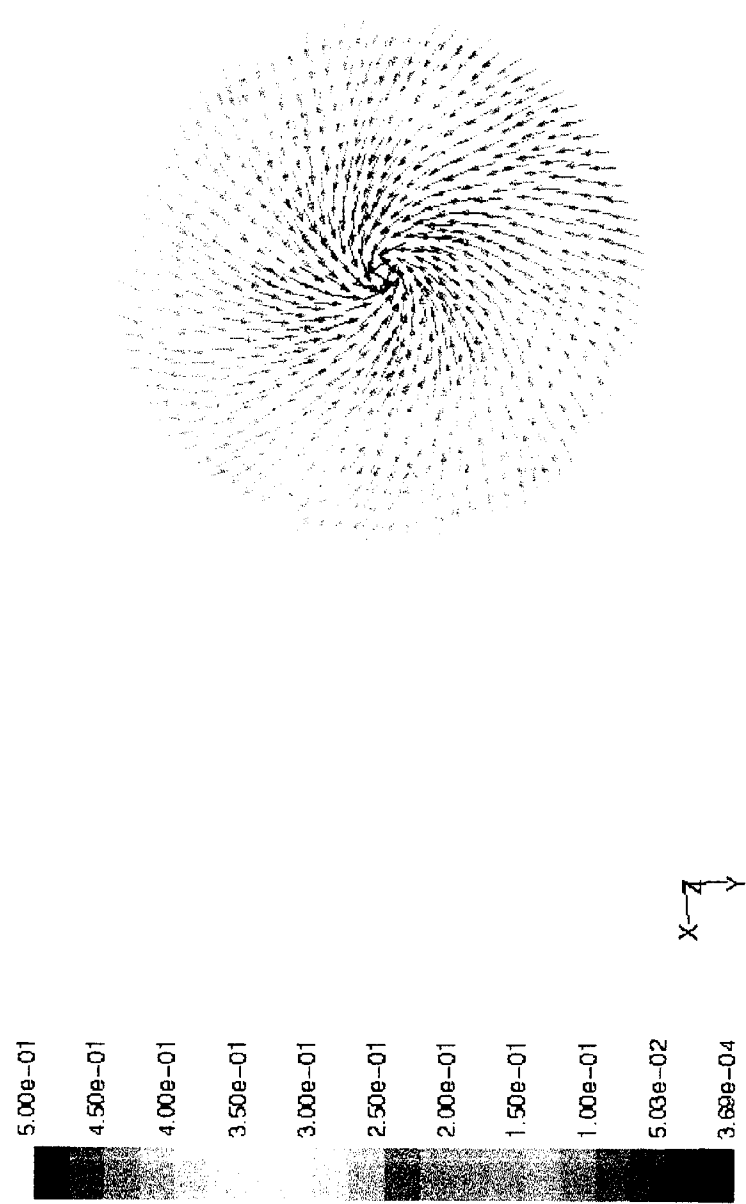

FIG. 8 illustrates a simulation showing gas motion at the plane of the substrate where the gas is spiraling with little turbulence.

A mathematical discussion from Schlicting-Boundary Layer Theory by Schlicting for a rotating gas field upon a flat surface. This is very similar to the proposed invention and shows the development of a uniform boundary layer. This illustrates how the boundary layer of gas is proportional to $$\sqrt{\frac{v}{w}} \quad v = \text{viscosity} \quad w = \text{rotational velocity}$$

The boundary layer in this instance is not dependent on radius, etc. This is critical to uniform CVD growth reactions.

Various modifications can be made to the present invention without departing from the apparent scope hereof.

| VORTEX BASED CVD REACTOR PARTS LIST | |
|---|---|
| 10 | CVD reactor |
| 12 | reactor base |
| 14 | reactor sidewall |
| 16a-n | clamps |
| 18 | reactor top |
| 20a-n | hardware assemblies |
| 22a-n | injector tubes |
| 24 | reactor interior |
| 26 | exhaust port |
| 28 | reactor base extension |
| 30 | flange |
| 32 | robotic arm access port |
| 34 | cavity |
| 36 | attachment ring |
| 38 | lower planar region |
| 40 | O-ring |
| 42a-n | machine screws |
| 44 | connecting support collar |
| 46 | heated chuck |
| 48 | densified carbon susceptor |
| 50 | wafer substrate |
| 50a | alpha-numeric symbol |
| 52 | lift yoke |
| 54 | air cylinder lift arm |
| 56a-n | ceramic lift pins |
| 58a-n | body holes |
| 60a-n | body holes |
| 62 | shutter |
| 62a | alpha-numeric symbol |
| 64 | multiply angled bracket |
| 66 | multiply angled bracket |
| 68 | channel |
| 70 | channel |
| 72 | plate |
| 74 | plate |
| 76 | thermocouple |
| 78 | resistance heater |
| 80 | flange |
| 82 | O-ring |
| 84 | lower flange |
| 86 | upper flange |
| 88 | O-ring |
| 90 | flange |
| 92 | spinning gas field |
| 94 | chemical vapors |

What is claimed is:

1. A vortex based CVD reactor comprising:

a. a reactor base;

b. a reactor sidewall located above and secured to the reactor base;

c. a reactor top located above, and secured and fitted to the reactor sidewall;

d. injector tubes tangentially oriented with respect to the reactor sidewall and secured to the reactor top;

e. a reactor interior comprised of inner surfaces of the reactor base, reactor side walls and a reactor top, said reactor interior having a decreasing diameter from the reactor top to the reactor base;

f. a heated densified carbon susceptor located in contact with a resistance heated chuck;

g. at least one lift yoke and ceramic wafer substrate support pin;

h. a robotic access port located in the reactor base, a positionable shutter aligned with the robotic access port; and, i. an exhaust port located at the upper region of the reactor top.

2. The reactor of claim 1, wherein the injector tubes, tangentially oriented with respect to the reactor sidewall and secured to the reactor top, are connected to a source of chemical vapors so as to introduce chemical vapors into the reactor in tangential fashion with respect to the reactor sidewall, thereby creating spinning gas fields which cause a uniform boundary layer to form over the substrate whereby the chemical vapors deposit uniformly.

3. A method of CVD using a vortex based CVD reactor adapted to cause a spinning gas field within the reactor interior, wherein the reactor interior includes a reactor side wall and the reactor side wall is characterized by a reduced lower diameter relative to the diameter adjacent the top of the reactor, the CVD method comprising the steps of:

a. introducing chemical vapors into the reactor interior simultaneously under sufficient pressure and at suitable temperature through injector tubes;

b. producing spinning gas fields in the reactor interior as a result of the chemical vapors emanating from the injector tubes;

c. orienting the injector tubes to direct the spinning gas fields containing chemical vapors tangentially with respect to the interior walls of the reactor sidewall;

d. allowing the spinning gas fields to move downward due to the reduced diameter of the reactor;

e. allowing the downward spiraling gas to hit the lower surface and substrate and is subject to drag, loss of velocity from drag which causes the gas to flow inward and subsequently upward to where the pressure is lower; and, f. the gas spirals upward and out of a reactor exhaust.

4. A CVD reactor comprising:

a. a circular reactor base, the circular reactor base having a first diameter;

b. a circular reactor top located above the reactor base, the circular reactor top having a second diameter, greater than the first diameter;

c. a reactor sidewall located between the circular reactor base and the circular reactor top and secured to the circular reactor base and the circular reactor top, wherein the reactor sidewall has a lesser diameter adjacent the circular reactor base and a greater diameter adjacent the circular reactor top;

d. a reactor interior defined by the circular reactor base, the circular reactor top, and the reactor sidewall;

e. a plurality of injector tubes, each of the injector tubes of the plurality of injector tubes secured to the circular reactor top and oriented substantially horizontally and tangentially directed relative to the reactor sidewall;

f. an exhaust port centrally located at the circular reactor top;

g. a plurality of spinning gas field pathways, each of the gas fields of the plurality leading simultaneously and complementarily from each of the injector tubes through a three sequential segments, the gas field pathways first segment following tangentially along and bounded by the sidewall and spiraling downward while following the reducing diameter of the sidewall and maintaining velocity until reaching the circular reactor base, the second segment, losing velocity and moving spirally inward and centrally, then the third segment spiraling upward centrally to exit at the exhaust port at the circular reactor top; and, h. a stationary substrate support situated upon the circular reactor base and in the spiraling inward second segment of the gas field pathways.

5. The CVD reactor of claim 4, wherein the plurality of injector tubes includes four injector tubes.

6. The CVD reactor of claim 5, wherein the four injector tubes of the plurality of injector tubes are distributed evenly adjacent the periphery of the circular reactor top.

7. The CVD reactor of claim 4, wherein the exhaust port is centrally located on the circular reactor top.

8. The CVD reactor of claim 4, wherein the circular reactor top and the reactor sidewall are secured by a plurality of hardware assemblies.

9. The CVD reactor of claim 4, wherein the circular reactor base and the reactor sidewall are secured by a plurality of clamps.

10. The CVD reactor of claim 4, wherein the reactor sidewall is surrounded by a resistance heater.

11. The CVD reactor of claim 9, wherein the circular reactor base includes a base flange at an upper edge of the circular reactor base with an O-ring held in the base flange and the reactor sidewall includes a lower sidewall flange, and wherein the O-ring seals the base flange to the lower sidewall flange when the plurality of clamps are tightened.

12. The CVD reactor of claim 8, wherein the circular reactor top includes a top flange at a lower edge of the circular reactor top and the reactor sidewall includes an upper sidewall flange with an O-ring held in the upper sidewall flange, and wherein the O-ring seals the upper sidewall flange to the top flange when the plurality of hardware assemblies are tightened.

13. The CVD reactor of claim 4, wherein the substrate support places a substrate surface at a plane characterized by spiraling and homogeneity of the second segments of the gas field pathways.

14. The CVD reactor of claim 4, further comprising:

i. means to position a substrate upon the stationary substrate support without separating the circular reactor base, reactor sidewall and circular reactor top.

15. The CVD reactor of claim 14, wherein the means to position includes a robotic arm access port located in the circular reactor base.

16. A method of providing a homogeneous reactant gas flow across a surface in a CVD reactor, whereat a substrate to be processed may be positioned at the surface, the method comprising:

a. providing a vertically oriented reaction chamber, having a circular reactor top, a circular reactor base, the circular reactor base having a smaller diameter than the circular reactor top, and a sidewall connecting the circular reactor top to the circular reactor base, the reaction chamber having a decreasing diameter lower in the reaction chamber, the reaction chamber further including: at least one generally horizontally oriented injector tube, said at least one horizontally oriented injector tube further being tangentially aligned relative to the sidewall and situated adjacent the circular reactor top of the reaction chamber, and an exhaust, the exhaust being centrally located on the circular reactor top; and, b. providing a gas supply of reactant gas to the injector tube forming a gas pathway with three sequential segments: a first segment spiraling downward and along the decreasing diameter of the reaction chamber, a second segment spiraling inward from the sidewall to a center of the reactor chamber and generally adjacent the circular reactor base, and a third segment spiraling upward from adjacent the center of the circular reactor base to the exhaust in the circular reactor top, wherein the second segment defines a surface of laminar flow suitable for processing a substrate, the laminar flow comprising a homogeneous gas flow.

17. The method of claim 16, wherein the injector tube is one of a plurality of tubes, distributed cooperatively adjacent to the circular reactor top.

18. The method of claim 16, wherein the injector tube is one of four injector tubes distributed cooperatively adjacent the circular reactor top.

* * * * *